(12) United States Patent
Rendler

(10) Patent No.: US 11,323,064 B2
(45) Date of Patent: May 3, 2022

(54) PROCESSING DEVICE AND METHOD FOR FORMING CONNECTION CONDUCTORS FOR SEMICONDUCTOR COMPONENTS

(71) Applicant: Fraunhofer-Gesellschaft zur Forderung Der Angewandten Forschung e.V., Munich (DE)

(72) Inventor: Li Carlos Rendler, Freiburg (DE)

(73) Assignee: Fraunhofer-Gesellschaft zur Förderung der Angewandten Forschung E.V., Munich (DE)

( * ) Notice: Subject to any disclaimer, the term of this patent is extended or adjusted under 35 U.S.C. 154(b) by 228 days.

(21) Appl. No.: 16/498,826

(22) PCT Filed: Mar. 29, 2018

(86) PCT No.: PCT/EP2018/058197
§ 371 (c)(1),
(2) Date: Sep. 27, 2019

(87) PCT Pub. No.: WO2018/178292
PCT Pub. Date: Oct. 4, 2018

(65) Prior Publication Data
US 2021/0111670 A1    Apr. 15, 2021

(51) Int. Cl.
*H01R 43/16* (2006.01)
*H02S 40/36* (2014.01)
(Continued)

(52) U.S. Cl.
CPC .............. *H02S 40/36* (2014.12); *B21D 13/02* (2013.01); *H01L 31/0508* (2013.01);
(Continued)

(58) Field of Classification Search
CPC ......... H02S 40/36; B21D 13/02; H01R 43/16; H01R 43/24; H01L 31/0508;
(Continued)

(56) References Cited

U.S. PATENT DOCUMENTS 4,301,322 A * 11/1981 Amick ................ H01L 31/0508
136/244
7,264,758 B2 * 9/2007 Ju ..................... B29C 45/14639
264/138

(Continued)

FOREIGN PATENT DOCUMENTS

DE          19915488        10/2000
EP           2466648         6/2012
(Continued)

*Primary Examiner* — Donghai D Nguyen
(74) *Attorney, Agent, or Firm* — Volpe Koenig

(57) ABSTRACT

A processing device for forming connection conductors for semiconductor components, in particular for producing a periodic structure, which device includes a forming unit for forming at least one connection conductor. The processing device has an advancing unit which is designed to move the connection conductors and the forming unit relative to one another in a direction of advance, and the forming unit has at least one step element, at least one forming element which can be moved relative to the step element, and a forming-element moving unit for moving the forming element relative to the stop element, the forming element, stop element and forming-element moving unit being designed to cooperate such that the connection conductor can be bent by moving the forming element between the stop element and the forming element by the forming-element moving unit. A method for forming connection conductors for semiconductor components is also provided.

16 Claims, 8 Drawing Sheets

(51) Int. Cl.
*H01L 31/05* (2014.01)
*H01L 31/18* (2006.01)
*H01R 43/24* (2006.01)
*B21D 13/02* (2006.01)

(52) U.S. Cl.
CPC .......... *H01L 31/188* (2013.01); *H01R 43/16* (2013.01); *H01R 43/24* (2013.01)

(58) Field of Classification Search
CPC .......... H01L 31/188; Y02E 10/50; B21F 1/04; Y10T 29/49117; Y10T 29/49169; Y10T 29/53213
USPC .......................................... 29/825, 854, 748
See application file for complete search history.

(56) References Cited

U.S. PATENT DOCUMENTS

| | | | |
|---|---|---|---|
| 9,698,292 B2 * | 7/2017 | Storbeck | H01L 31/0508 |
| 2014/0060615 A1 | 3/2014 | Gretler et al. | |

FOREIGN PATENT DOCUMENTS

| | | |
|---|---|---|
| EP | 2704213 | 3/2014 |
| WO | 2008080160 | 7/2008 |

\* cited by examiner

PROCESSING DEVICE AND METHOD FOR FORMING CONNECTION CONDUCTORS FOR SEMICONDUCTOR COMPONENTS

BACKGROUND

The invention relates to a processing device and a method for forming connection conductors for semiconductor components.

For the electrical contacting of semiconductor components, connection conductors are used. Such connection conductors are used, in particular, for the interconnection of multiple semiconductor components, for example, for the interconnection of solar cells in a solar cell module. Here, it is known to connect adjacent solar cells in a series circuit through the use of cell connectors as connection conductors.

For such electrical and mechanical interconnection of semiconductor components using connection conductors, for example, due to different coefficients of expansion or asymmetric interconnection on the front and rear of the semiconductor component, thermomechanical stress and deformation of the semiconductor component can occur. This thermomechanical stress could be a trigger for degradation or failure of the semiconductor components. Also, deformation could make the further processing of the connected semiconductor components more difficult.

For reducing such thermomechanical stress, it is known to use connection conductors with a periodic, wave-like structure. EP 2 466 648 A1 describes a device for producing such a wave-like bent connection conductor in which the straight-line connection conductor is guided between two meshing gearwheels and in this way receives a periodic, wave-like structure that is specified by the gearwheels.

SUMMARY

The present invention is based on the object of improving the previously known processing device for forming connection conductors for semiconductor components and expanding the area of use.

This object is achieved by a processing device for forming connection conductors for semiconductor components and a method for forming connection conductors for semiconductor components having one or more features of the invention. Advantageous constructions of the processing device and of the method are found below and in the claims.

The processing device according to the invention is preferably designed to perform the method according to the invention, in particular, a preferred embodiment thereof. The method according to the invention is preferably designed to be performed by the processing device according to the invention, in particular, a preferred embodiment thereof.

The processing device according to the invention for forming connection conductors for semiconductor components has a forming unit for forming at least one connection conductor.

It is essential that the processing device has an advancing unit that is designed to move the connection conductor and forming unit in an advancing direction relative to each other and such that the forming unit has at least one stop element, at least one forming element that can be displaced relative to the stop element, and a forming-element displacement unit for displacing the forming element relative to the stop element. The forming element, stop element, and forming-element displacement unit are designed to interact such that the connection conductor can be bent by displacement of the forming element by the forming-element displacement unit between the stop element and the forming element.

In contrast to the prior art, in which meshing gearwheels rotating in opposite directions are used as the forming unit, the processing device according to the invention thus has a forming element that is displaced by a forming-element displacement unit relative to a stop element. The connection conductor can thus be bent by the displacement motion in that it contacts, on one side, the stop element and, on the other side, the forming element.

The invention is based on the knowledge of the inventor that the production of a periodic, wave-like structure through bending of the connection conductor between two meshing gearwheels typically leads to damage to the connection conductor: the forming of the connection conductor between the two gearwheels leads to stretching in some areas of the connection conductor, so that, in periodic spacings, this results in the narrowing of the cross section of the connection conductor. This produces a non-uniform resistivity and, in particular, an increase of the resistivity due to the areas with reduced cross section. Furthermore, tests have shown that damage to the connection conductor due to deformation of the connection conductor, for example, formation of edges and/or indentation points in the connection conductor is often produced during processing by gearwheels, as tests by the inventor have shown.

Furthermore, the period length and amplitude of a periodic structure of a connection conductor created using two gearwheels running in opposite directions are defined by the geometry of the gearwheels.

The processing device according to the invention avoids these disadvantages in that the forming element is displaced relative to the stop element and in this way the connection conductor arranged between the forming element and stop element is bent. This type of processing leads to no damage or at least considerably less damage of the connection conductor and likewise to none or only a negligible change in cross section.

In addition, by selecting the advancing speed or the advancing distance in interaction with the displacement path between the forming element and stop element, a variation of amplitude and period length of the structure of the processed connection conductor can be achieved; in particular, the amplitude and/or period length can be specified and can also be varied.

Thus, in this way, degradation up to failure of the connected semiconductor components is reduced due to less damage and/or narrowing of the connection conductor. Furthermore, the processing device is flexible and can be used for different applications and different semiconductor components, which require different period lengths and/or amplitudes of a periodic structure of the connection conductor. Likewise, connection conductors can be produced with a changing amplitude and/or with a changing period length.

The method according to the invention for forming connection conductors for semiconductor components, especially for forming a periodic structure, has the following processing steps:

In one processing step A, a connection conductor is arranged between a stop element and a forming element of a forming unit. In a processing step B, the connection conductor is belt by displacement of the forming element relative to the stop element, and in a processing step C, the connection conductor is moved relative to the forming unit.

This produces the advantages mentioned above.

Advantageously, between processing step B and processing step C, the forming element is displaced relative to the stop element in the opposite direction compared with processing step B. By retracting the forming element before moving the connection conductor relative to the forming unit in processing step C, the relative movement between the connection conductor and forming unit is simplified, because there is no or only minimal braking due to friction between the connection conductor, forming element, and stop element. In particular, it is advantageous to displace the forming element between processing step B and processing step C such that, during the movement of the connection conductor relative to the forming unit in processing step C, there is no contact between connection conductor and forming element. Advantageously, before an advancing movement of the connection conductor, the forming element is moved into an advance position, wherein the forming element is located in the advancing direction behind the stop element, preferably central to the stop element. In this way, contact between the connection conductor and forming element during the advancing movement is prevented or at least considerably reduced.

Advantageously, the forming unit has, in addition to the stop element as the first stop element, at least one second stop element and, in addition to the forming element as the first forming element, at least one second forming element, which are arranged such that the connection conductor can be arranged between the first and second stop elements and between the first and second forming elements.

Processing is preferably performed such that, through displacement of a forming element, the connection conductor is brought into contact with this forming element and a stop element and, in this way, is bent into a first bending direction. Then the other forming element is displaced, so that the connection conductor is brought into contact with the other forming element and the other stop element, in order to create bending in an opposite direction.

Advantageously, the first forming element and first stop element are arranged on one side and the second forming element and second stop element are arranged on the opposite side of the connection conductor. In this configuration, bending is realized in a first direction by the first forming element and second stop element and, accordingly, bending is realized in the opposite direction by the second forming element and first stop element. Through a cyclic repeating of these displacement movements with advancing of the connection conductor in-between a periodic structure of the connection conductor can be generated in a simple way.

Advantageously, the forming-element displacement unit is connected to the first and second forming elements, so that the first and second forming elements can be displaced relative to the first and second stop elements by the forming-element displacement unit.

An advantageous, structurally simple construction is produced by arranging the first and second forming element on a common forming element carrier. In this way, a simultaneous displacement of the first and second forming elements can be achieved by the forming-element displacement unit in a simple way.

Processing of the connection conductor is here performed preferably such that the forming element carrier is displaced in a first direction, in order to achieve a bending in a first bending direction, then the forming element carrier is displaced in the opposite direction, so that there is no contact between the forming elements and the connection conductor. Then the connection conductor is advanced, followed by further displacement of the forming element carrier in the opposite direction, in order to achieve bending in the opposite direction. Then, a displacement of the forming element carrier in the original direction is performed, so that there is no contact between the forming element and the connection conductor and finally the connection conductor is advanced. By cycling through these processing steps, a periodic structure can be produced in a simple way.

The advancing unit is preferably supported in front of or behind the forming unit in the advancing direction of the connection conductor. In particular, it is advantageous that the advancing unit is supported in front of the forming unit in the advancing direction of the connection conductor. This produces the advantage that the advancing unit connects to the not-yet-processed connection conductor, which is typically in a straight line. Furthermore, there is no negative effect on the processed structure of the connection conductor, which could be realized by an advancing unit supported after the forming unit.

Advantageously, the forming element can be displaced by the forming-element displacement unit in a displacement direction, which encloses with the advancing direction an angle in the range of 45° to 90°, preferably 70° to 90°, in particular, 80° to 90°, preferably 90°. This produces improved conditions for the bending of the connection conductor. In particular, it is advantageous to displace the forming elements perpendicular to the advancing direction of the connection conductor. In this way, a compact design of the processing device is also possible.

Another advantage of the processing device according to the invention consists in simple ways for taking advantage of parallelization possibilities:

In a preferred embodiment, the processing device is designed to process a plurality of connection conductors guided in parallel. The forming unit therefore preferably has a plurality of stop elements and a plurality of forming elements.

In particular, it is advantageous that the processing device has a plurality of stop elements that are preferably arranged in a line, wherein one connection conductor can be arranged between every two adjacent stop elements. In this preferred embodiment, the processing device also has a plurality of forming elements, whose number preferably corresponds to the number of stop elements and which are preferably arranged in a line, especially preferred parallel to the stop elements, wherein one connection conductor can be arranged between every two adjacent forming elements.

In this way, several connection conductors arranged in parallel can be bent simultaneously. Preferably, here, all forming elements are displaced in a common first displacement direction, in order to achieve a bending of the connection conductor in a first bending direction. Then, preferably, a displacement of all forming elements in a second displacement direction is performed, which is preferably opposite the first displacement direction, in order to achieve a bending of the connection conductor in a second bending direction, wherein an advance of all connection conductors is preferably performed between the two bending procedures.

Advantageously, for the simultaneous processing of at least two connection conductors arranged in parallel, a forming element is used that is arranged between the connection conductors for processing these two connection conductors: through the displacement of the forming element in the direction of the first connection conductor, this connection conductor is formed, while through the displacement of the forming element in the direction of the other connection conductor, preferably through the displacement in the opposite direction, the other connection conductor is formed. In a preferred embodiment of the processing device according to the invention for the parallel forming of it connection conductors, preferably n+1 forming elements are provided.

A structurally robust and space-saving design is produced in a preferred embodiment in which the plurality of forming elements is arranged on a common forming element carrier that can be displaced relative to the stop elements by the forming-element displacement unit.

Furthermore, the advancing unit is preferably designed to move all connection conductors simultaneously relative to the forming unit in an advancing direction.

The processing device advantageously has a control unit that is connected to the forming-element displacement unit and the advancing unit and is designed such that the control unit can selectively specify an amplitude and a period length for a periodic structure of the connection conductor generated by the processing device.

In this way, a generated structure can be easily adapted to the desired geometrical requirements.

Advantageously, the processing device has a position detection unit for detecting contacting points of a semiconductor component. By such a position detection unit, the positions of relevant elements on the semiconductor component can be determined individually. This enables an individual adaptation of the processing to the semiconductor component.

In particular, it is advantageous that the processing device has a control unit as described above and the position detection unit is designed to interact with the control unit so that the shape of the connection conductor generated by forming is specified as a function of detection data of the position detection unit, preferably such that an amplitude and/or a period length and/or an offset for forming a periodic structure is specified. In this way, in particular, faulty contacts due to the varying positions of contacting points on the semiconductor components can be compensated for: in a preferred embodiment of the method according to the invention, contacting points of the semiconductor component can be detected by the position detection unit and the position of these contacting points, in particular, their spacing, can be compared with specified data, in particular, a specified period length and/or amplitude. Likewise, the spacing can be compared with a specified standard spacing.

If the deviation exceeds a specified tolerance threshold, an adaptation of the period length and/or amplitude can be performed. To do this, preferably a function is specified that describes the period length and/or the amplitude as a function of the spacing of the contacting points. With such a function, depending on the spacing of the contacting points determined by the position detection unit, an individual period length and/or amplitude can then be determined for the respective semiconductor component.

For the connection of semiconductor components by connection conductors, in addition to the previously mentioned effects that lead to a change of spacing of contacting points in the horizontal direction that corresponds to the extension direction of the connection conductor, there are also effects that lead to a vertical offset, i.e., approximately perpendicular to an extension direction of the connection conductor:

For example, semiconductor components one next to the other cannot be oriented exactly, so that the semiconductor components cannot lie exactly in a line, but instead there is a height offset, which thus also leads to a vertical offset of the contacting points to be contacted. Likewise, in the manufacturing method of the semiconductor component, errors can occur, for example, a misalignment while forming the contacts, in particular, while forming the contacts by screen printing, so that the semiconductor component itself has a height offset of the contacting points for the electrical connection with respect to the standard. In these cases, it is thus advantageous in a preferred configuration to analyze a height offset by the detection unit and, in the event of a height offset exceeding a specified threshold, performing a compensation for the processing of the connection conductor such that the height offset is reproduced in the forming of the connection conductor. In particular, here it is advantageous to compensate the detected height offset in the area of the connection conductor that lies between the semiconductor components when connecting two adjacent semiconductor components.

As stated above, it is thus advantageous to specify the shape of the connection conductor generated by the processing device as a function of the detection data of the position detection unit, in particular, the amplitude, period length, or a vertical offset of the periodic structure as a function of the measurement data of the position detection unit in at least one sub-area of the connection conductor, preferably for the compensation of detected deviations with respect to the spatial position of contacting points of the semiconductor components.

The invention further relates to a semiconductor component contacting unit for the electrical contacting of at least one semiconductor component with a processing device according to the invention, in particular, a preferred embodiment thereof, and with a contacting unit for the electrical connection of one or more connection conductors with the at least one semiconductor component, wherein the contacting unit is arranged after the processing device, so that one or more connection conductors processed by the processing device can be connected in an electrically conductive way to the semiconductor component by the contacting unit.

The contacting unit is preferably designed for producing an electrical contact by soldering. In this way, known contacting units can be used, which have a heating plate and/or heating lamp for heating the semiconductor component and for melting the solder.

In another advantageous embodiment, the contacting unit is designed for producing an electrical contact by adhesion (with electrically conductive adhesive). In this way, the connection can be produced with lower heat input compared with a soldering process. Adhesive connections can also reduce mechanical stress.

Furthermore, the semiconductor contacting unit preferably has supply units for supplying solder for a soldering process or adhesive for an adhesion process at the contacting points and guide units for the processed connection conductors to the semiconductor component. Likewise, the use of soldered connection conductors is also possible. This produces the advantage that no solder must be supplied.

In the method according to the invention, there is preferably no movement of the connection conductor relative to the forming unit by the advancing unit during the bending of the connection conductor. This prevents damage to the connection conductor and also reduction of the precision of the bending process for simultaneous bending and displacement.

Advantageously, in the method according to the invention, in processing step B, the connection conductor is bent through displacement of the forming element relative to the stop element in a first displacement direction and in a processing step D after processing step C, the connection conductor is bent through displacement of another forming element in a second displacement direction relative to a second stop element, wherein the first and second displacement direction are different, preferably opposite each other. As already described above, in this way, a periodic structure can be generated in a simple way.

Advantageously, a sequence B-C-D-C of the processing steps is repeated multiple times, in order to produce a periodic structure. Advantageously, in processing steps B and D, the connection conductor is not moved by the advancing unit, in order to prevent damage and to increase the precision during bending.

Advantageously, in the method according to the invention, the position of characteristic points, in particular, contacting points on the semiconductor component, is detected and, as a function of this measurement data, a characteristic parameter for the processing of the connection conductor is specified, in particular, preferably an amplitude and/or a period length for the formation of a periodic structure. Here, the processing can thus be adapted to inaccuracies in the production of the semiconductor component.

As previously described, a bending is realized by the displacement of the forming element. During the bending process, the connection conductor is thus preferably located between the stop element and forming element, that is, the stop element and forming element are located on opposite sides of the connection conductor.

Advantageously, the advancing direction in which the connection conductor is moved by the advancing unit is parallel to the longitudinal extent of the not yet processed connection conductor. In this way, damage to the connection conductor due to friction within the advancing unit is prevented.

It is within the scope of the invention that for processing the connection conductor, the connection conductor is arranged fixed in place and the forming unit is moved by the advancing unit relative to the stationary connection conductor. In this advantageous configuration, thus, in particular, a sequential processing can be realized, in that one or more connection conductors are processed in parallel, wherein the connection conductors are stationary and then the processed connection conductors are fed to one or more semiconductor components for forming connections, in particular, electrically conductive connections.

Here, advantageously the connection conductor is initially formed in a first area for connection to a first semiconductor component. Then the semiconductor component is arranged on this formed area and connected to the connection conductor mechanically and in an electrically conductive way. Then the other, not yet formed connection conductor is processed and then connected to another semiconductor component mechanically and in an electrically conductive way. This produces the advantage that the connection process is performed sequentially and does not have to be performed simultaneously for all semiconductor components to be connected to the connection conductor.

In one advantageous alternative embodiment, initially the connection conductor is formed completely and then the semiconductor components are positioned on the connection conductors and mechanically connected in an electrically conductive way.

In one advantageous embodiment of the processing device, the forming unit is stationary, and the connection conductor is moved by the advancing unit. This produces the advantage that complicated components for moving the forming unit can be eliminated.

The processing device according to the invention and the method according to the invention are basically suitable for creating structures, in particular, periodic structures of the connection conductor in any length. Advantageously, the processing device has at least one bounding element that is arranged after the forming unit. The bounding element is preferably designed as a wall, in particular, preferably as a bar, and arranged such that movement of the processed connection conductor in the bending direction is prevented or at least reduced. In particular, for the advantageous formation of the processing device for processing multiple parallel connection conductors, preferably multiple bounding elements arranged preferably in parallel are arranged after the forming unit.

By use of one or more bounding elements as described above, an advance of the processed connection conductor in the advancing direction is thus also guaranteed during the advance of the unprocessed connection conductor by the advancing unit.

The bounding elements preferably have a spacing relative to each other that corresponds at least to the maximum total amplitude of the generated structure of the connection conductor. As explained below, advantageously a vertical offset of contacting points of the semiconductor components can be compensated by the shape of the connection conductor. Advantageously, the bounding elements therefore have a spacing that corresponds at least to the sum of the total amplitude and a specified maximum vertical offset that is to be compensated, if necessary, by the shape of the connection conductor.

Advantageously, the processing device has a separating unit with separating tools, in particular, cutting tools, in order to cut the processed connection conductors. The separating unit is arranged after the forming unit and, in particular, preferably after the bounding element. In the construction of the processing device for processing multiple connection conductors arranged in parallel, the separating unit preferably has separating tools for each connection conductor.

The present invention is especially suited to form periodic structures, in particular, rectangular, in particular, rectangular with beveled flanks, wave-like, sinusoidal, triangular, or sawtooth-shaped structures on the connection conductors or structures at least approximating such shapes.

The shape of the forming element and/or the horizontal spacing (that is, the spacing in the extension direction of the connection conductor) is preferably adapted by the forming element and stop element to the shape of the connection conductor to be generated by forming processes.

The forming element preferably has a round or at least rounded shape, in order to reduce the risk of damage to the connection conductor. The same applies to the stop element.

Advantageously, the forming element has, in the advancing direction, a length that is less than one half the period length of the periodic structure to be produced.

Advantageously, cylindrical forming elements, whose cylinder axes are arranged perpendicular to the advancing direction, are used. In particular, the use of cylindrical forming elements with circular or elliptical cross-sectional areas is advantageous. The use of cylindrical forming elements with other cross-sectional areas is also within the scope of the invention, in particular, rectangular cross-sectional areas, preferably with rounded edges.

BRIEF DESCRIPTION OF THE DRAWINGS

Additional advantageous features and preferred embodiments will be explained below with reference to embodiments and the figures. Shown herein are.

DETAILED DESCRIPTION

In the figures, the same reference symbols designate elements that are the same or have the same action.

Figure 1:
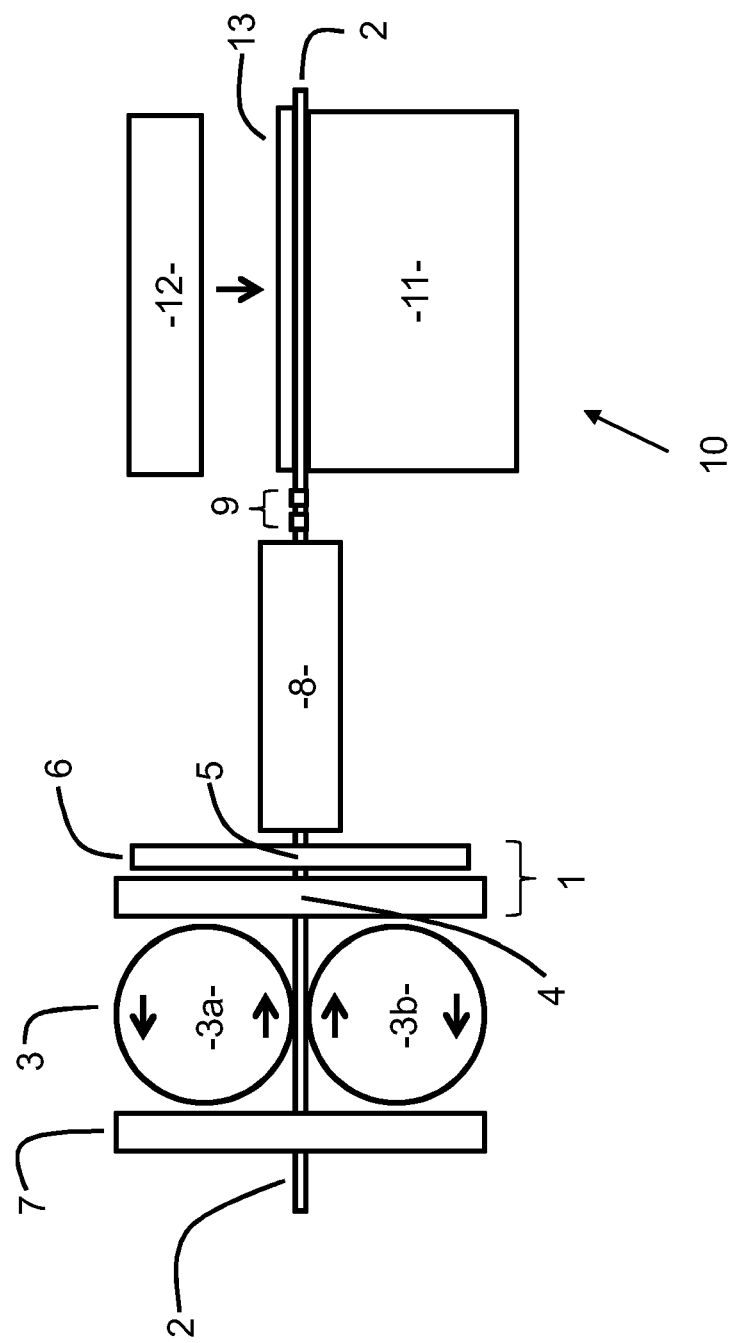
FIG. 1 a first embodiment of a processing device according to the invention in a side view, FIG. 2 the first embodiment according to FIG. 1 in a plan view from above, FIG. 3 a second embodiment of a processing device according to the invention with movable forming unit in a plan view from above, FIG. 4 an application example for processed connection conductor for electrical series connection of solar cells contacted on both sides, FIG. 5 an application example for processed connection conductor for electrical series connection of reverse side contact solar cells, FIG. 6 an application example for explaining the adaptation of the period length to different cell spacings, FIG. 7 an embodiment for explaining the adaptation of the period length for different spacings of contacting points, and FIG. 8 an embodiment for explaining the adaptation of the shape of the connection conductor to a vertical offset.

In FIG. 1, a first embodiment of a processing device according to the invention is shown in a side view. The processing device is designed for forming a plurality of connection conductors arranged in parallel for semiconductor components. In the present case, photovoltaic solar cells are shown as the semiconductor components for connecting by the connection conductors. Use for other semiconductor components, in particular, large surface area semiconductor components, for example, OLEDs, is also possible.

Figure 2:
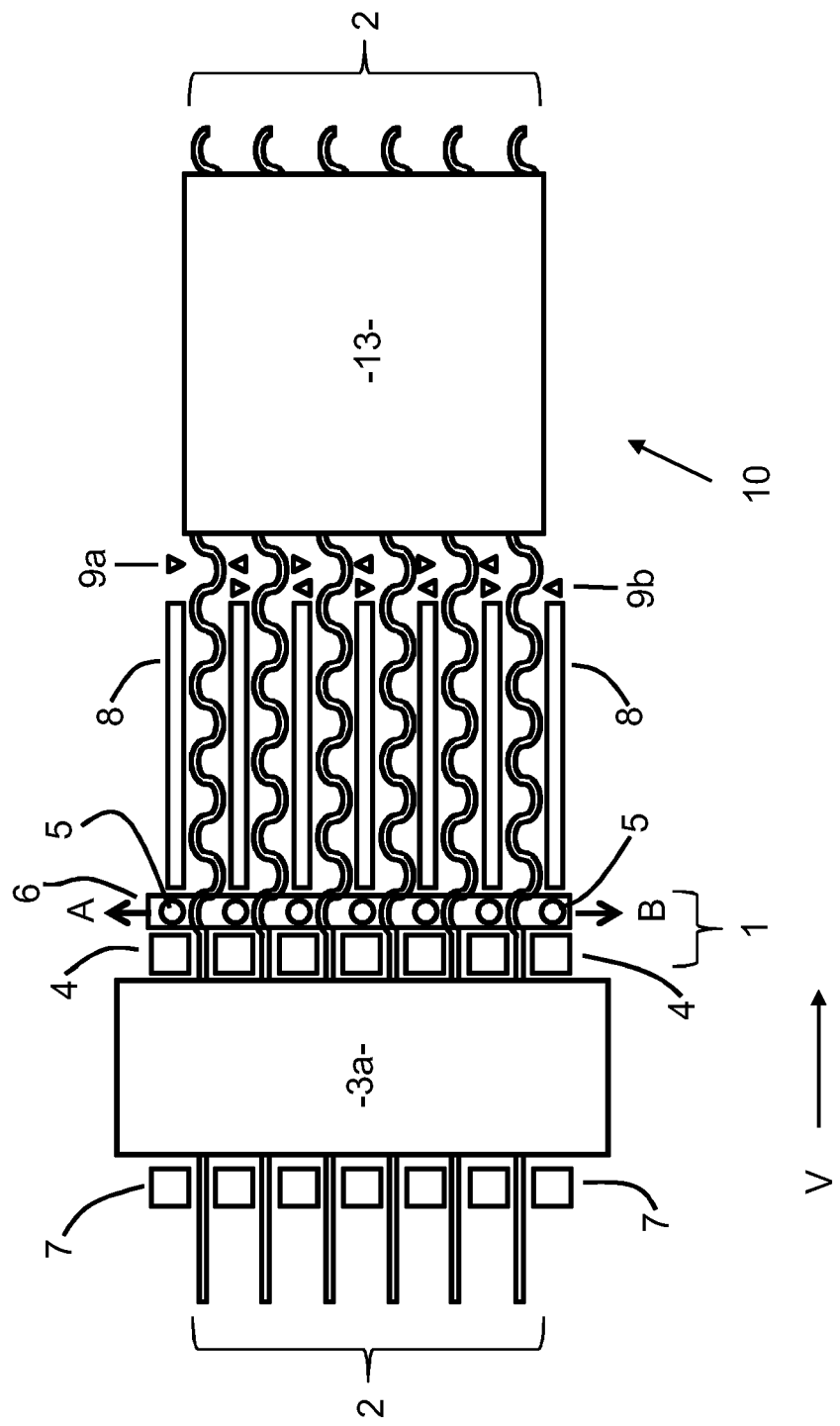

In FIG. 2, the processing device is shown in a plan view from above. Additional details will be explained below with reference to FIGS. 1 and 2:

The processing device has a forming unit 1 for forming the connection conductors 2 arranged in parallel.

Furthermore, the processing device has an advancing unit 3 that comprises, in the present case, two rollers 3a and 3b that are driven by motors and rotate in opposite directions. By use of the advancing unit 3, the connection conductors 2 are fed to the forming unit 1 simultaneously in an advancing direction V parallel to the longitudinal extent of the connection conductor and thus the connection conductor and forming unit are moved relative to each other in the advancing direction. For the present embodiment, the forming unit is designed to be fixed in place and the connection conductors are moved by the advancing unit relative to the forming unit.

The forming unit 1 has a plurality of stop elements 4 and a plurality of forming elements 5. The stop elements 4 and the forming elements 5 are arranged in corresponding lines, wherein both lines are parallel to each other and perpendicular to the advancing direction V. For reasons of clarity, in FIG. 2, only the first and the last stop element of the plurality of stop elements arranged in a line are provided with reference symbols 4. The same applies to the deformation bodies 5 arranged in a line.

All forming elements 5 are arranged on a common forming element carrier 6. In the plan view from above according to FIG. 2, the forming element carrier 6 is under the connection conductor 2.

Using a forming-element displacement unit operated by a motor, the forming element carrier 6 and thus also the forming elements 5 are displaced in a first displacement direction A or a second displacement direction B opposite the first displacement direction (see FIG. 2).

Thus, by the forming-element displacement unit, the forming elements 5 can be displaced relative to the stop elements 4, wherein the displacement direction (A, D) is perpendicular to the advancing direction V, i.e., encloses an angle of 90°.

If the forming element carrier 6 is now displaced, each connection conductor 2 is brought into contact with a forming element 5 and a stop element 4 and the connection conductor is bent. Depending on the selected displacement direction A or B, the bending direction for the bending process also changes accordingly.

As can be seen in FIG. 2, the connection conductors are thus each arranged between two stop elements 4 and two forming elements 5.

The processing device is thus designed for the parallel processing of 6 connection conductors 2 and has, for this purpose, 7 forming elements 5. For typical uses for the production of solar cell modules, a larger number of parallel connection conductors is useful, in particular, in the range of 10 to 50 parallel connection conductors.

The advancing unit 3 is arranged before the forming unit 1. In this way, an error-free advancing motion is guaranteed, because the rollers 3a and 3b of the advancing unit contact the straight-line, unprocessed connection conductors. In addition, a change of the shape of the processed connection conductors by the advancing unit 3 is prevented in this way.

Arranged before the advancing unit 3 are additional guide elements 7 that are likewise arranged in a line parallel to the line of the stop elements 4. These guide elements 7 are used to produce exact positioning for the feeding of the connection conductors to the advancing unit.

Arranged after the forming unit 1 is a plurality of bounding elements of the processing device. The bounding elements 8 are designed as bars and are arranged parallel to each other and parallel to the advancing direction V, so that each processed connection conductor 2 is surrounded as seen in FIG. 2 on both sides by a bounding element, that is, both in the displacement direction A and also in the displacement direction B there is a bounding element. Thus, for a number n of connection conductors, there are n+1 bounding elements 8.

The bounding elements 8 have the effect that the position of the already processed areas of the connection conductors is not changed or is changed only slightly during a bending process in the bending direction.

The processing device further has a separating device 9 with cutting tools 9a and 9b. Using the separating device 9, the processed connection conductors 2 can thus be separated.

In FIGS. 1 and 2, a contacting unit 10 is also shown, with a heating plate 11 and a soldering device constructed as a soldering lamp 12. Between the heating plate 11 and soldering lamp 12, there is the semiconductor component 13, in the present case, a photovoltaic solar cell.

As explained in more detail below, for the series circuit connection of two adjacent solar cells, the connection conductors for one solar cell are arranged on the rear and then on the front for the adjacent solar cell and connected mechanically by the feeding of solder and heat by heating plate 11 and soldering lamp 12 in an electrically conductive way to the respective solar cell.

Contacting unit 10 and the previously described processing device thus form a semiconductor contacting unit for the contacting of a semiconductor component.

The forming elements 5 have a cylindrical shape with round cross section, wherein the cylinder axis in FIG. 2 is perpendicular to the plane of the drawing. The stop elements 4 have approximately a rectangular block-shaped form, wherein the edges, however, are rounded, in order to prevent damage to the connection conductor.

As can be seen in FIG. 2, wave-like periodic structures can be produced with the processing device:

In one embodiment of the method according to the invention, in a processing step A, the connection conductor 2 is arranged between the stop elements 4 and the forming elements 5 of the forming unit 1. In a processing step B, the connection conductor 2 is bent by the displacement of the forming elements 5 in the displacement direction A relative to the stop elements 4.

Then the forming elements 5 are retracted by displacement in the displacement direction B, so that, in the advancing direction V, the forming elements 5 are arranged in the middle or at least approximately in the middle behind the stop elements 4. Thus, in this advancing position of the forming elements 5 there is no contact between the forming elements 5 and connection conductors 2. In a processing step C, the connection conductor is moved in the advancing direction V by the advancing unit 3. In a processing step D, the forming elements 5 are displaced in the displacement direction B and thus the connection conductor 2 is bent in the opposite direction. Then, the forming elements 5 are retracted in the displacement direction A, in order to reach the advancing position as described above and as shown in FIG. 2. This sequence of processing steps is repeated in a cycle, so that the periodic structure of the connection conductor 2 shown in FIG. 2 is produced.

Figure 3:
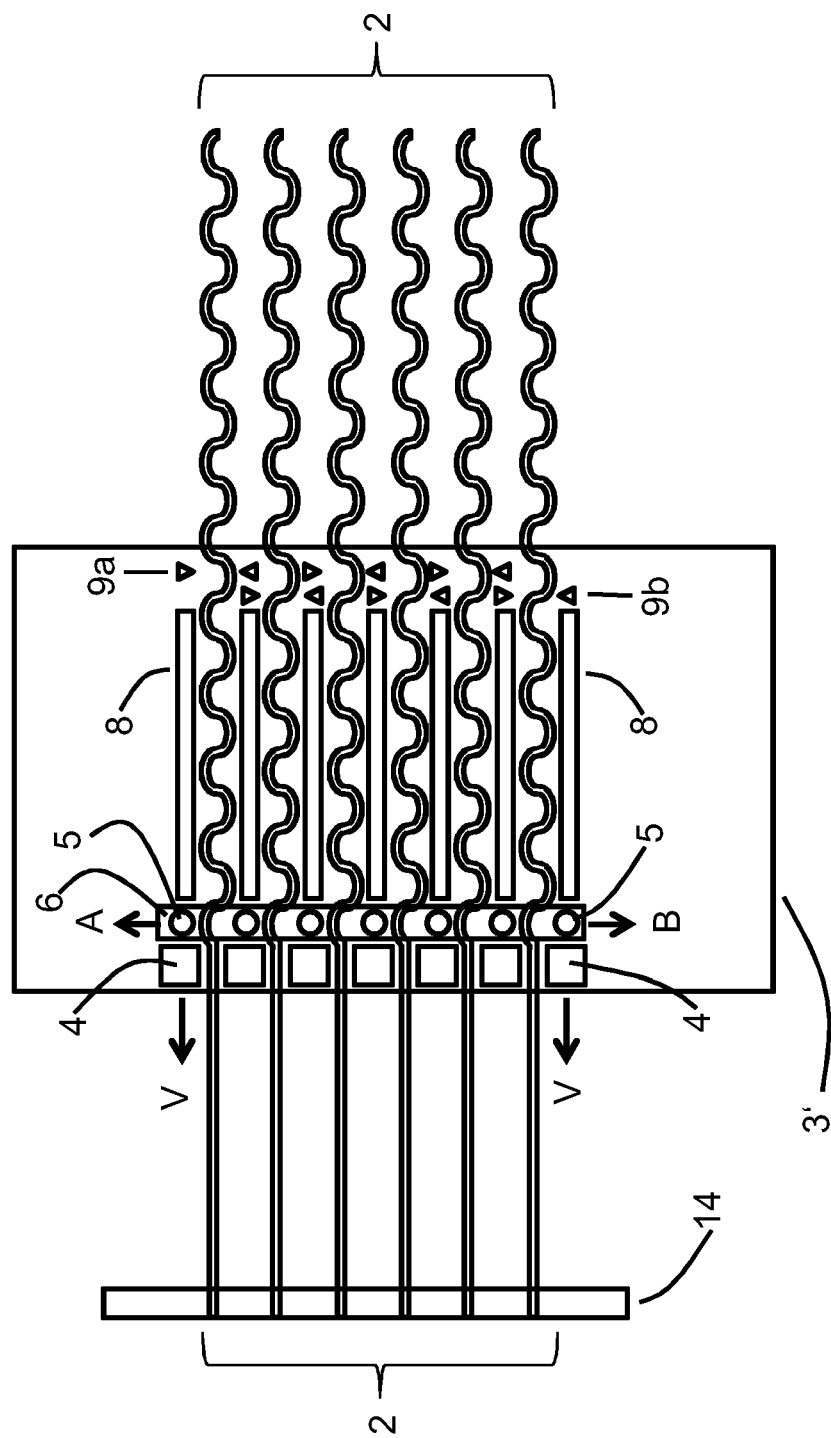

In FIG. 3, a second embodiment of a processing device according to the invention is shown. For preventing repetition, only the essential differences to the processing device according to FIG. 1 will be discussed below: the processing device according to FIG. 3 has an advancing device 3' that is designed as a holder that can be displaced in direction V by a motor. The stop elements 4, forming-element displacement unit, forming element carrier 6 with the forming elements 5, bounding elements 8, and cutting tools 9a and 9b are arranged on the advancing device 3'. The connection conductors are fixed on a holder 14. Thus, in this embodiment, the connection conductors 2 are fixed in position, while the stop elements 4, forming-element displacement unit, and the forming element carrier 6 with the forming elements 5 are moved in direction V between the bending processes in direction V.

Figure 4:
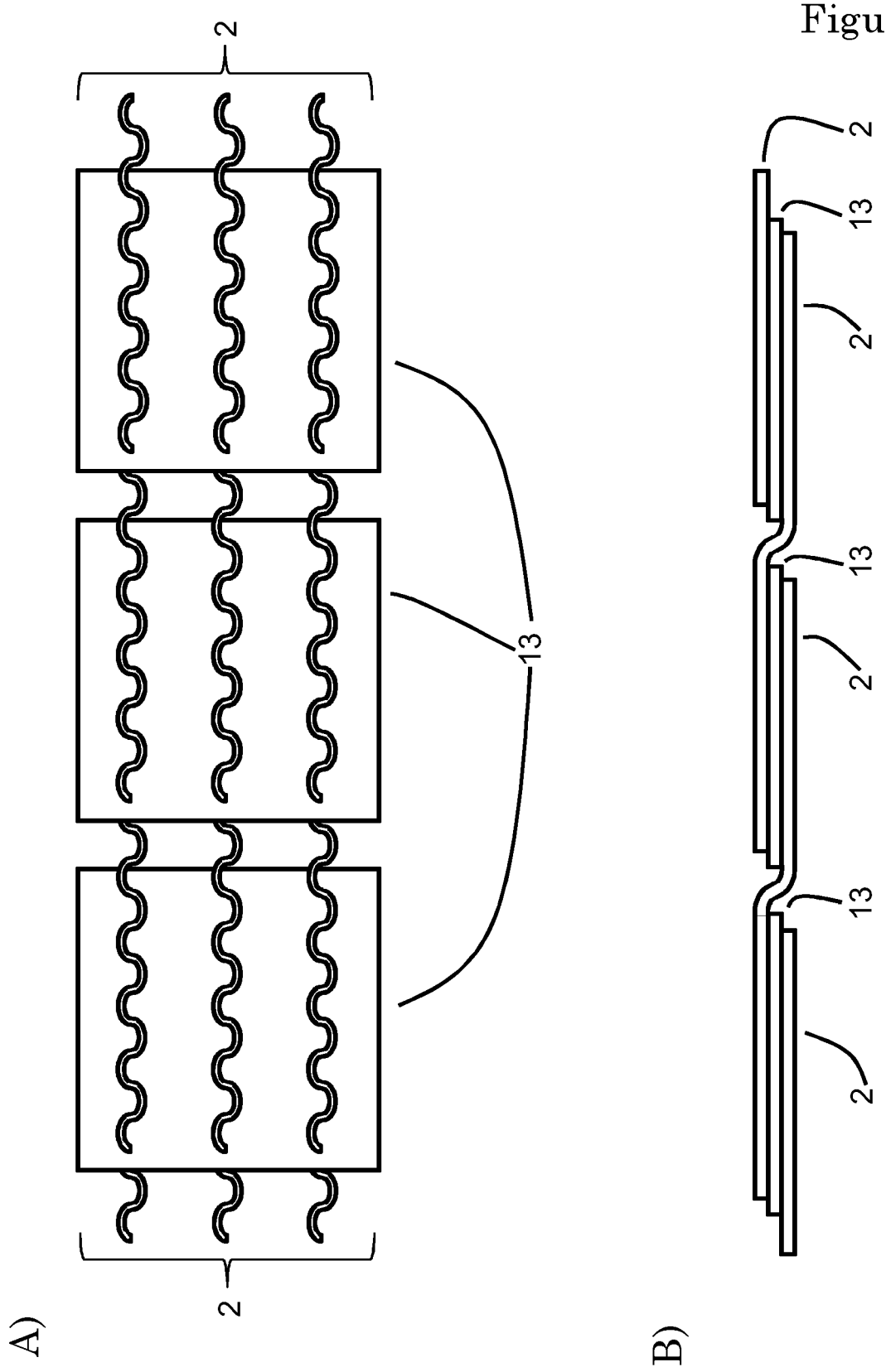

In FIG. 4, the use of the connection conductors produced with the processing device shown in FIGS. 1 and 2 for the series circuit connection of the semiconductor components 13 is shown. Sub-figure a shows a plan view from above and sub-figure b shows a side view. The semiconductor components 13 formed as photovoltaic solar cells to be contacted on both sides are contacted by the connection conductors 2 alternately on the front side shown in sub-figure a. Each semiconductor component 13 is further contacted to an adjacent semiconductor component on its rear, in order to form a series circuit connection. In the side view according to sub-figure b, the connection conductors 2 thus run from the front side of one semiconductor component 13 to the rear of the adjacent semiconductor component.

Figure 5:
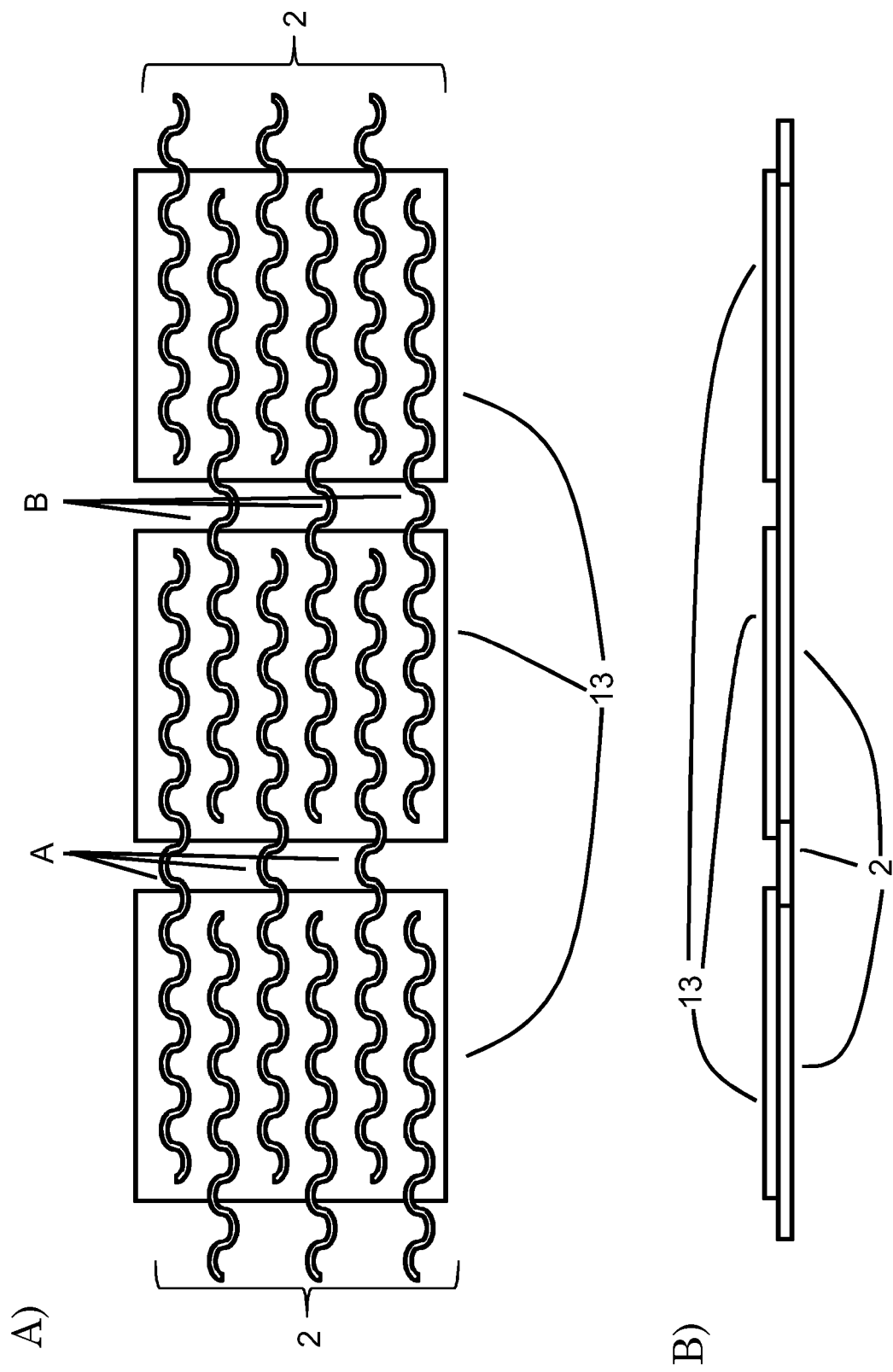

In FIG. 5, the interconnection of rear contact solar cells is shown. In this example, the semiconductor components 13 are designed as rear contact solar cells. In such solar cells, the metallic structures for contacting the solar cell are located on the rear, both for the n-polarity and also the p-polarity. In this way, an interconnection of adjacent solar cells is possible, without the connection conductors having to be guided from a front side to a rear side. It is also possible to use semiconductor components with interchanged n and p polarities.

The rear contact solar cells therefore have, on the rear, p and n contact structures in alternating rows. Accordingly, the connection conductors can be divided into two groups:

As can be seen in FIG. 5a, two adjacent solar cells are connected in an electrically conductive way alternating from a group A or group B of connection conductors. In the shown example, according to the plan view from below shown in FIG. 5a, the group A of connection conductors connect n-contacting elements of the left solar cell to p-contacting elements of the middle solar cell. The middle solar cell is rotated by 180° relative to the left (and also relative to the right) solar cell, so that an inverse alternating sequence of n and p contacting elements is realized. Therefore, through the connection conductor 2 of group B, an electrically conductive connection of the n-contacting elements of the middle solar cell to the p-contacting elements of the right solar cell is realized.

In FIG. 5b, a side view of these three rear contact solar cells connected by connection conductors 2 is shown.

Figure 6:
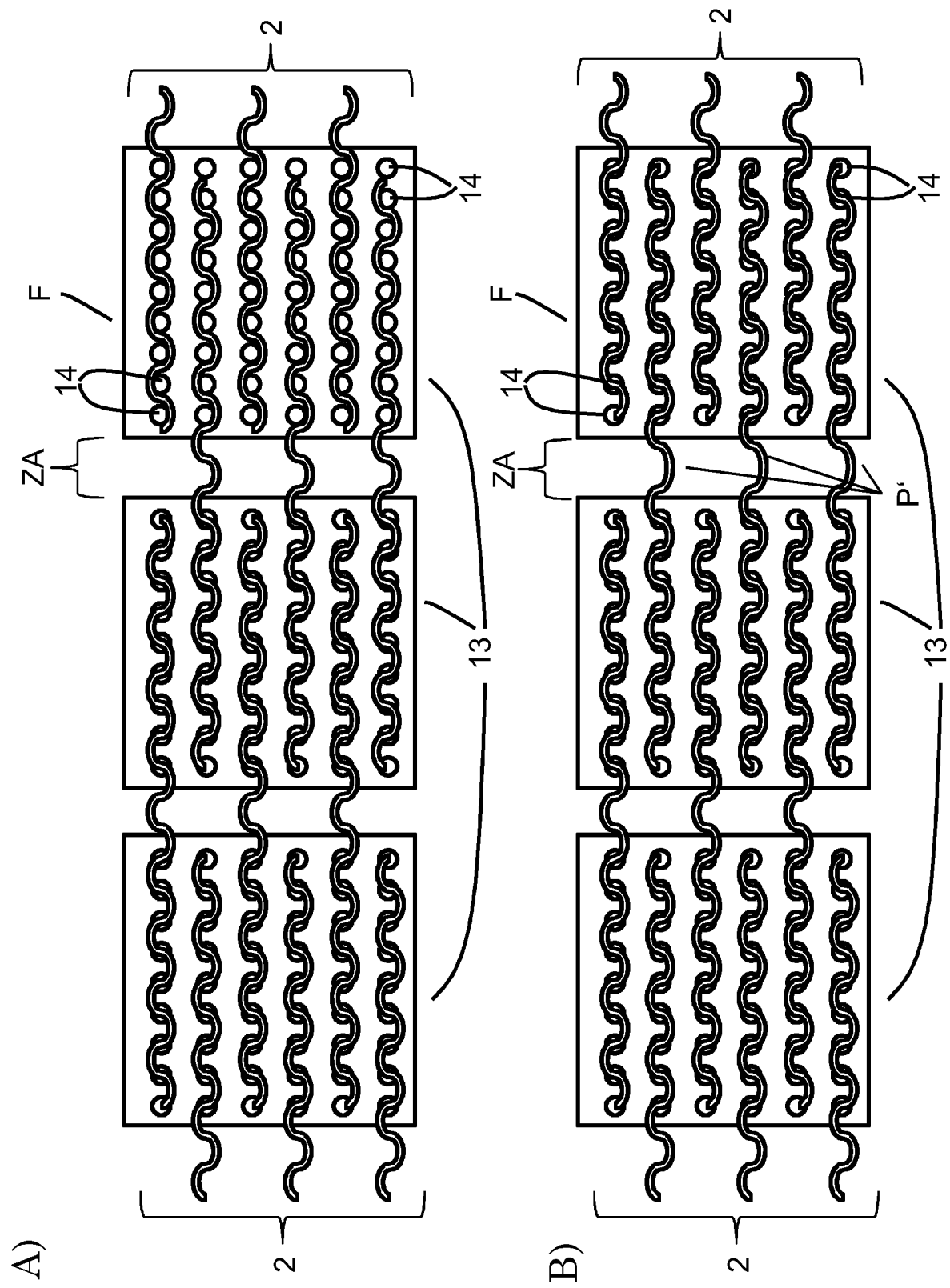
Figure 7:
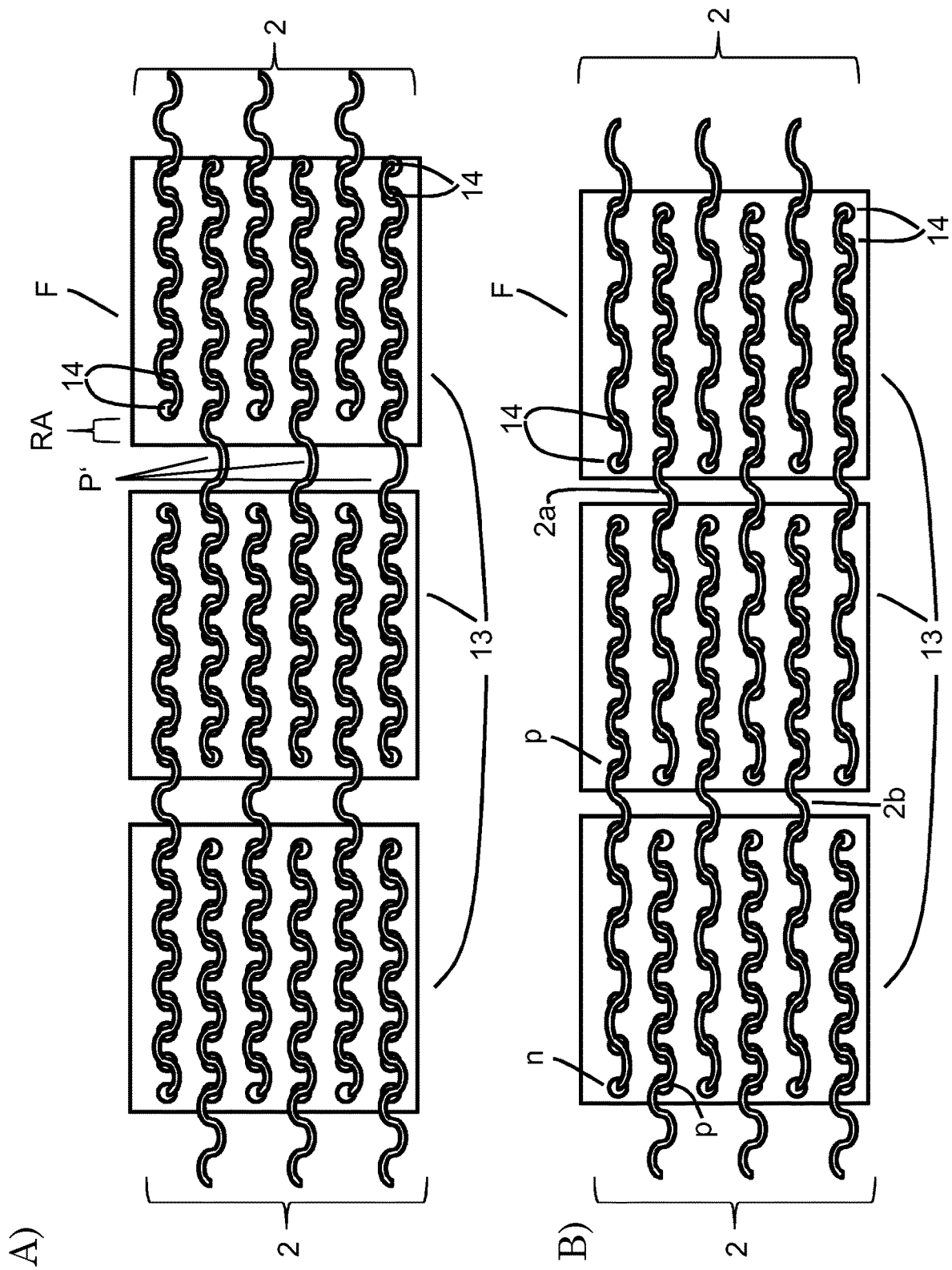
Figure 8:
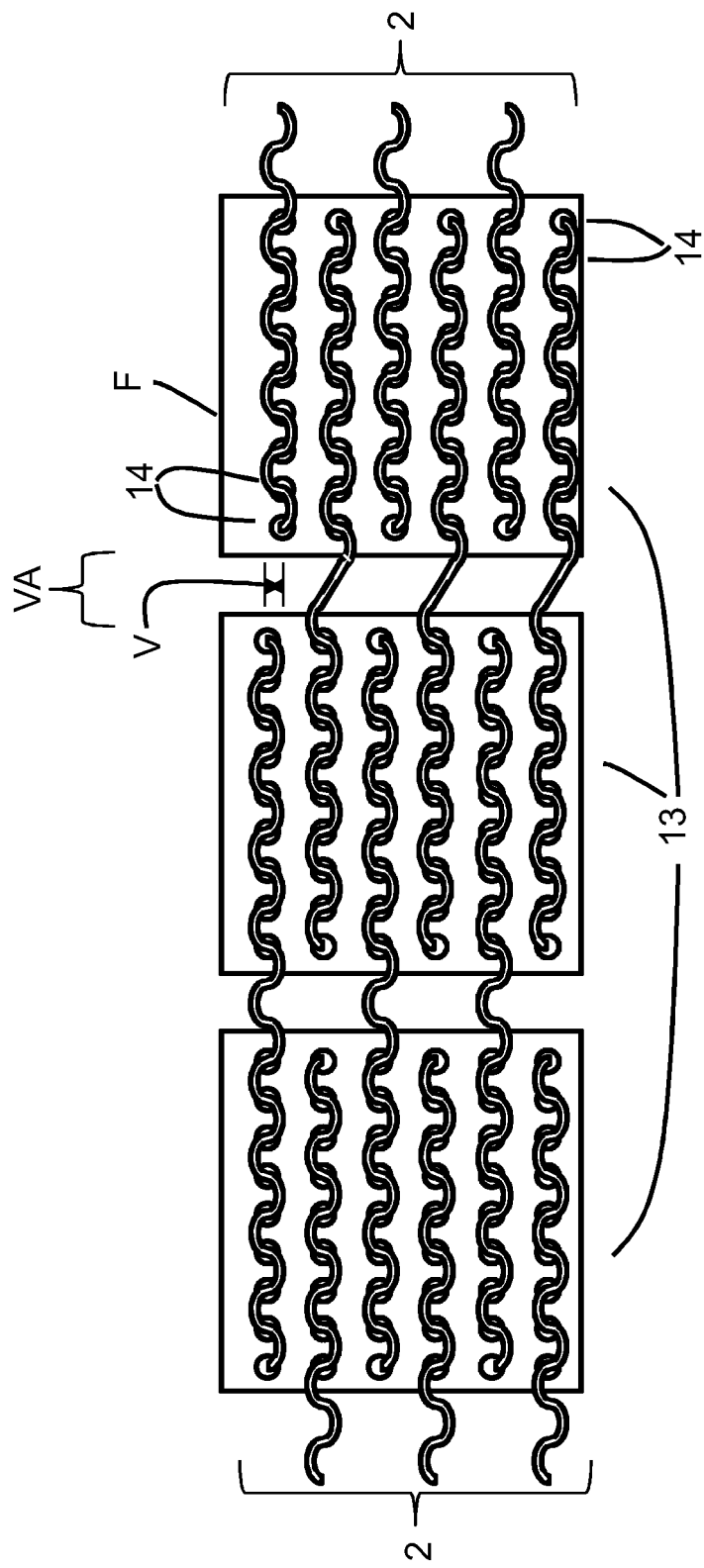

In FIGS. 6, 7, and 8, contacting points of the semiconductor components 13 formed as rear contact solar cells are drawn as circles. A mechanical and electrically conductive connection to connection conductors 2 is intended to be realized at these contacting points. For better clarity, only four contacting points 14 are shown in the respective right cells.

In FIG. 6, the use of an embodiment of the device according to the invention and the method according to the invention for adapting the period length of the connection conductor to different cell spacings are shown: for this purpose, a processing device according to FIG. 1 can be used, which further has a control unit that is connected to the advancing device 3 and the forming-element displacement unit for displacement of the forming element carrier 6. Using the control unit, the period length and amplitude of the generated periodic structure of the connection conductor can be specified. As can be seen in FIG. 6 in sub-figure a, the arrangement of semiconductor components 13 that are formed in the present case also as rear contact solar cells can produce different cell spacings. In the present case, the cell spacing ZA increases between the middle and right cells, for example, relative to the cell spacing between the left and middle cells. As can be seen in FIG. 6 in sub-figure a, a constant period length with the correct cell spacing according to the left and middle cells produces a correct contacting of all contacting points (shown as circles). If the cell spacing ZA is increased, however, a displacement of the contacting points relative to the periodic structure is realized, as long as the change in spacing is not an integer multiple of a half period length of the periodic structure. In the example shown in FIG. 6a, the contacting points of the semiconductor component 13 shown on the right does not form an electrical connection or not an adequate electrical connection.

In this embodiment of a method according to the invention, the edges of the semiconductor components 13 are detected as characteristic points. Alternatively, instead of the edges, other local marking points could also be used, e.g., contacting points, in particular, contact pads, alignment markers, in particular, for preceding screen-printing processes or markers on the semiconductor component provided just for this detection.

Using the control unit, a test is performed whether the spacing of these characteristic points corresponds to a specified value, so that with a constant period length, a correct contacting of the contacting points 14 is performed. However, if the spacing between the semiconductor components 13 deviates from a specified standard parameter, the control unit calculates a deviating period length, in order to compensate for the deviation in the spacing ZA. This deviating period length is used in the present embodiment for generating the connection conductor for connecting the middle and right semiconductor component 30 for the average period. As can be seen in FIG. 6b, those connection conductors 2 that connect the middle semiconductor component 13 to the right semiconductor component 13 have an increased period length in the intermediate space between the semiconductor components. This increased period length is marked with P'.

In this embodiment of a method according to the invention, the spacing between the semiconductor components 13 is detected as a characteristic point and if there is deviation, the advancing device 3 and the forming-element displacement unit are controlled such that, for compensating for the difference in the spacing of the semiconductor components, a changed period length P' is generated approximately in the middle between the outermost contacting points 14 of two adjacent semiconductor components when the connection conductor 2 related to this spacing is generated.

The detection can be performed here by a camera that captures a two-dimensional image, in particular, a CCD camera and an image processing unit. For example, these elements could be integrated at the location of the soldering lamp 12 in FIG. 1. Likewise, such image capture devices for detecting the three-dimensional position of the characteristic points could also be integrated into other devices for the series-like arrangement of the semiconductor components, in particular, a device for manufacturing a string for a solar cell module.

In FIG. 7, two other application examples are shown, in which the period length of the periodic structure is adapted to the connection conductor as a function of the detected characteristic points:

In FIG. 7a, an example is shown in which the edge spacing RA of the respective first contact points 14 to the associated edge is detected. In this way, as described above, the positions of the edge and of the next contacting point 14 is detected by a CCD camera and the spacing is determined from these positions. If this spacing deviates from a specified standard spacing, then—as already described for FIG. 6—the period length of the connection conductor 2 is adapted in the area that lies between the two adjacent semiconductor components 13 formed as rear contact solar cells, in order to compensate for the deviation from the standard spacing. As shown in FIG. 7a, for the solar cell F on the right, an error has occurred in the protection, which led to a displacement of all contact points 14 to the right, so that the spacing RA of every first contact point 14 to the left edge of the solar cell F is greater than what corresponds to the standard (see the left or middle solar cell). Accordingly, the period length of the relevant connection conductor 2 was increased in the area between the middle and the right solar cells (see reference symbol P'), so that a correct contacting of the contacting points 14 is realized by the connection conductor 2.

In FIG. 7b, an example is shown in which the n-contacting structures have a different spacing to each other than relative to the p-contacting structures:

As already described above, the semiconductor components 13 formed as rear contact cells have contacting elements 14 that are arranged in lines and are shown as circles. As marked in the example, the upper row of the solar cells arranged on the left have n-contacting structures. Accordingly, the row underneath has p-contacting structures. This row-like, alternating arrangement is given in all rear contact solar cells shown in the figures. As also already described, however, the middle solar cell is rotated by 180°, so that here the topmost row has p-contacting structures and accordingly, the row underneath has n-contacting structures and here, these rows also continue in alternating switching.

In this example, the n-contacting structures have a larger spacing to each other compared with the p-contacting structures. Thus, for example, connection conductor 2a connects n-contacting points of the middle solar cell (with larger spacings) to p-contacting points of the right solar cell (with smaller spacings); connection conductor 2b connects n-contacting points of the left solar cell (with larger spacings) to p-contacting points of the middle solar cell (with smaller spacings).

The connection conductors 2 are therefore designed such that approximately half of the connection conductors are specified to have a larger period length that corresponds to twice the spacing of the n-contacting structures. Accordingly, for the remaining connection conductors, a smaller period length is specified that corresponds to twice the spacing of the p-contacting structures. In this embodiment of a method according to the invention, a sequence of period lengths—in the present case, two—is specified by the control unit for a connection conductor, as well as a total length or number of periods, according to which a change to the next specified period is to be performed.

In FIG. 8, the use of an embodiment of the device according to the invention and the method according to the invention for adapting the shape of the connection conductors to a vertical offset of the contacting elements 14 of the semiconductor components 13 is shown:

Also here, a processing device according to FIG. 1 can be used, wherein the spacing of the bounding elements 8 to each other is, in this case, the sum of the maximum desired total amplitude plus a specified, maximum vertical offset to be compensated. As already described for FIGS. 6 and 7, by a detection unit, the position of the contacting elements 14 is checked. As can be seen in FIG. 8, in this embodiment there is a faulty solar cell F on the right, in which the horizontal rows of the contacting elements 14 are shifted downward relative to the standard according to the left and middle solar cells. Thus, there is a vertical offset V that is determined by the position detection unit. The control unit modifies the forming of the connection conductors for connecting the middle and right solar cells such that, in the area VA that corresponds to the area between the edge contacting elements of the middle solar cell and the edge contacting elements of the right solar cell, the offset V is compensated, as can be seen in FIG. 8.

The previous descriptions, in particular, for FIGS. 6, 7, and 8, show advantageous applications for characteristic points for detecting the spacing between two adjacent semiconductor components, the spacing of a contacting point of a semiconductor component to an edge, in particular, the next closest edge of the semiconductor component, the spacing between two contacting points of a semiconductor component, and/or the vertical offset of the contacting points, in particular, the vertical offset of the contacting points of two adjacent semiconductor components.

The detected spacing or offset is preferably compared with a specified standard and, in the event of deviation, one or more period lengths of the generated periodic structure of the connection conductor are adapted, in order to compensate for the deviation. Because also several of the previously mentioned deviations can occur, it is especially advantageous to detect several, preferably all previously mentioned spacings and, if necessary, compensate for a deviation by a change to one or more of the period lengths.

The invention claimed is:

1. A processing device for forming connection conductors for semiconductor components, comprising:
a forming unit (1) for forming at least one connection conductor,
an advancing unit (3) configured to move the connection conductor (2) and forming unit (1) in an advancing direction relative to each other,
the forming unit (1) has at least one stop element (4), at least one forming element (5) that can move relative to the stop element (4), and a forming-element displacement unit for displacing the forming element (5) relative to the stop element (4),
the forming element (5), the stop element (4), and the forming-element displacement unit are configured to interact such that the connection conductor (2) is adapted to be bent between the stop element (4) and the forming element (5) by displacement of the forming element by the forming-element displacement unit, and
an advancing distance of the forming element is adjustable in an advancing direction in order to allow formation of different ones of the connection conductors having different amplitudes of bends in the connection conductors.

2. The processing device according to claim 1, wherein the stop element comprises a first stop element, and the forming unit (1) includes, in addition to the first stop element (4), at least one second stop element (4) and, the forming element (5) comprises a first forming element (5), and in addition to the first forming element includes at least one second forming element (5), which are arranged such that the connection conductor (2) is adapted to be arranged between the first and the second stop elements (4) and between the first and the second forming elements (5).

3. The processing device according to claim 2, the first and the second forming elements (5) are displaceable relative to the first and the second stop elements (4) using the forming element displacement unit such that, by the displacement of the first forming element, the connection conductor (2) is adapted to be bent in a first bending direction and, by the displacement of the second forming element, the connection conductor (2) is adapted to be bent in a second bending direction, wherein the first and second bending directions are different from each other.

4. The processing device according to claim 3, wherein the first and the second forming elements (5) are arranged on a common forming element carrier (6).

5. The processing device according to claim 1, wherein the advancing unit (3) is positioned in front of or behind the forming unit (1) in an advancing direction of the connection conductor.

6. The processing device according to claim 1, wherein the forming element (5) is displaceable by the forming-element displacement unit in a displacement direction that encloses an angle in a range from 45° to 90 with the advancing direction.

7. The processing device according to claim 1, further comprising a control unit that is connected to the forming-element displacement unit and to the advancing unit and is configured such that, using the control unit, an amplitude and a period length are selectively specifiable for a periodic structure of the connection conductor that is adapted to be produced by the processing device.

8. The processing device according to claim 7, further comprising a position detection unit for detecting contacting points of a semiconductor component, and the position detection unit is configured to interact with the control unit so that a shape of the connection conductor that is adapted to be produced by the processing device is specified as a function of detection data of the position detection unit, and at least one of an amplitude, period length, or an offset of the periodic structure is specifiable as a function of the measurement data of the position detection unit.

9. A semiconductor contacting unit (10) for contacting a semiconductor component in combination with a processing device according to claim 1, the contacting unit (10) being configured for the mechanical and electrical connection of one or more connection conductors (2) with the semiconductor component (13), and the contacting unit (10) is arranged after the processing device, so that one or more connection conductors (2) processed by the processing device are adapted to be connected to the semiconductor component (13) mechanically and in an electrically conductive manner.

10. A processing device for forming connection conductors for semiconductor components, comprising:
a forming unit (1) for forming at least one connection conductor,
an advancing unit (3) configured to move the connection conductor (2) and forming unit (1) in an advancing direction relative to each other,
the forming unit (1) has at least one stop element (4), at least one forming element (5) that can move relative to the stop element (4), and a forming-element displacement unit for displacing the forming element (5) relative to the stop element (4),
the forming element (5), the stop element (4), and the forming-element displacement unit are configured to interact such that the connection conductor (2) is adapted to be bent between the stop element (4) and forming element (5) by displacement of the forming element by the forming-element displacement unit,
wherein the processing device is configured to process a plurality of the connection conductors (2) guided in parallel, and the stop element comprises a plurality of stop elements (4) that are arranged in series, wherein one of the connection conductors (2) is adapted to be arranged between every two adjacent ones of the stop elements (4), the forming element comprises a plurality of forming elements (5), having a quantity that corresponds to a number of the stop elements (4) and which are arranged in series parallel to the stop elements (4), and one of the connection conductors (2) is adapted to be arranged between every two adjacent forming elements (5), and the plurality of forming elements (5) is arranged on a common forming element carrier (6) that is displaceable by the forming-element displacement unit relative to the stop elements (4).

11. A method for forming connection conductors for semiconductor components, comprising the following method steps:
- A) arranging a connection conductor between a stop element (4) and a forming element (5) of a forming unit (1),
- B) bending the connection conductor through displacement of the forming element relative to the stop element (4), and
- C) moving the connection conductor relative to the forming unit (1),
- wherein an advancing distance of the forming element is adjustable in an advancing direction in order to allow formation of different ones of the connection conductors having different amplitudes of bends in the connection conductors.

12. The method according to claim 11, further comprising during the bending of the connection conductor, there is only minimal or no movement of the connection conductor relative to the forming unit (1).

13. The method according to claim 11, further comprising in processing step B), bending the connection conductor by displacement of the forming element relative to the stop element (4) in a first displacement direction and, in a processing step D), bending the connection conductor by displacement of another forming element in a second displacement direction relative to a second stop element (4), wherein the first and second displacement direction are different from each other.

14. The method according to one of claim 13, further comprising repeating a sequence of the processing steps of B-C-D-C multiple times with no movement of the connection conductor relative to the forming unit (1) in the processing steps B and D.

15. A method for forming connection conductors for semiconductor components, comprising the following method steps:
- A) arranging a connection conductor between a stop element (4) and a forming element (5) of a forming unit (1),
- B) bending the connection conductor through displacement of the forming element relative to the stop element (4),
- C) moving connection conductor relative to the forming unit (1), and
- detecting a position of characteristic points on the semiconductor component and as a function of the measurement data, and specifying a characteristic parameter for processing the connection conductor, wherein a shape of the connection conductor produced by forming is specified as a function of the detection data of the position detection unit for the production of a periodic structure.

16. The method according to claim 15, wherein at least one of an amplitude, a period length, or an offset is specified for the production of a periodic structure.

* * * * *